(12) United States Patent
Kwan et al.

(10) Patent No.: US 12,072,251 B2
(45) Date of Patent: Aug. 27, 2024

(54) FORCE MEASUREMENT DEVICE AND METHOD FOR BONDING OR ENCAPSULATION PROCESS AND APPARATUS INCORPORATING THE DEVICE

(71) Applicant: ASMPT SINGAPORE PTE. LTD., Singapore (SG)

(72) Inventors: Ka Shing Kwan, Singapore (SG); Ajit Shriman Gaunekar, Singapore (SG); Zhi Tao Wang, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/683,453

(22) Filed: Mar. 1, 2022

(65) Prior Publication Data

US 2023/0280218 A1    Sep. 7, 2023

(51) Int. Cl.
| | | |
|---|---|---|
| *G01L 1/04* | (2006.01) | |
| *B22F 3/03* | (2006.01) | |
| *B22F 3/12* | (2006.01) | |

(52) U.S. Cl.
CPC ............... *G01L 1/04* (2013.01); *B22F 3/03* (2013.01); *B22F 3/12* (2013.01); *B22F 2203/13* (2013.01)

(58) Field of Classification Search
CPC ....... G01L 5/12; G01L 5/0076; G01L 5/0071; G01L 5/0066; G01L 1/06; G01N 2203/0617; G01N 3/18; G01N 2203/0026; G01N 3/42–46; G01Q 60/366; H01L 224/796–79625; B30B 11/265; B30B 15/0094; B30B 15/28; B30B 15/281

See application file for complete search history.

(56) References Cited

U.S. PATENT DOCUMENTS

| | | | | |
|---|---|---|---|---|
| 4,202,433 A | * | 5/1980 | Baltschun | B30B 15/285 91/356 |
| 4,299,131 A | * | 11/1981 | Seitz | G01R 31/66 73/789 |
| 4,939,918 A | * | 7/1990 | Schoch | B30B 15/0094 72/453.13 |
| 5,076,107 A | * | 12/1991 | Timmermans | G01N 9/08 73/437 |
| 5,187,987 A | * | 2/1993 | Anderson | G01N 3/20 73/865.6 |

(Continued)

FOREIGN PATENT DOCUMENTS

WO    WO 2021/075966 A1    4/2021

*Primary Examiner* — Tran M. Tran
(74) *Attorney, Agent, or Firm* — OSTROLENK FABER LLP (57) ABSTRACT

A device for measuring a force applied to a component when the component is being bonded to a component carrier, or when the component is being encapsulated includes a deformable portion and a contacting stem connected to the deformable portion. The deformable portion is configured to incorporate a sensor for detecting a degree of deformation of the deformable portion caused by application of the force in order to measure the force. In use, the contacting stem is positionable to contact the component or the component carrier so that the deformable portion is deformed when the force is applied to the component. One or more such devices may be included in a sintering or encapsulation apparatus for measuring the said force.

20 Claims, 8 Drawing Sheets

(56) References Cited

U.S. PATENT DOCUMENTS

| | | | | |
|---|---|---|---|---|
| 5,214,967 A * | 6/1993 | Grogan | G01L 1/16 | 73/862.642 |
| 5,361,615 A * | 11/1994 | Kirii | G01L 5/0076 | 72/19.8 |
| 5,483,994 A * | 1/1996 | Maurer | G01L 9/006 | 73/706 |
| 6,216,581 B1 | 4/2001 | Murao | G01L 5/0076 | 92/161 |
| 6,718,820 B2 * | 4/2004 | Kwon | G01N 3/48 | 73/83 |
| 7,423,511 B2 * | 9/2008 | Nakasone | G01L 1/26 | 29/595 |
| 7,430,926 B2 * | 10/2008 | Haaser | G01L 5/0019 | 73/862.06 |
| 7,654,159 B2 * | 2/2010 | Enoksson | G01Q 30/02 | 73/777 |
| 7,716,975 B2 * | 5/2010 | Rey | G01L 5/162 | 73/146 |
| 7,775,413 B2 * | 8/2010 | Oblak | B29C 66/8185 | 228/110.1 |
| 8,113,066 B2 * | 2/2012 | Eckstein | B23Q 17/0966 | 73/862.045 |
| 8,393,200 B2 * | 3/2013 | Scherzinger | G01N 3/42 | 73/81 |
| 8,717,043 B2 * | 5/2014 | Bodenweber | H01L 22/12 | 324/464 |
| 8,794,079 B2 * | 8/2014 | Bodenweber | G01L 5/0038 | 73/818 |
| 9,061,462 B2 * | 6/2015 | Bredeau | B30B 15/0094 | |
| 9,366,591 B2 * | 6/2016 | Bodenweber | G01L 5/0057 | |
| 9,415,557 B2 * | 8/2016 | Furukawa | B30B 1/181 | |
| 9,488,562 B1 * | 11/2016 | Alam | G01N 3/303 | |
| 9,518,876 B2 * | 12/2016 | Wulff | G01L 3/108 | |
| 9,536,760 B2 * | 1/2017 | De Beijer | H01L 24/97 | |
| 9,724,473 B2 * | 8/2017 | Demas | G01L 1/2262 | |
| 10,139,327 B2 * | 11/2018 | Puchnin | G01B 7/003 | |
| 10,436,562 B2 * | 10/2019 | Bellaton | G01Q 60/366 | |
| 10,466,128 B2 * | 11/2019 | Divisi | G01L 19/0618 | |
| 10,571,346 B2 * | 2/2020 | Okada | G01L 3/106 | |
| 10,571,379 B2 * | 2/2020 | Oliver | G01B 11/16 | |
| 10,576,705 B2 * | 3/2020 | Takeuchi | B30B 15/0094 | |
| 10,641,669 B2 * | 5/2020 | Schlipf | G01L 5/0038 | |
| 10,875,139 B2 * | 12/2020 | Fischer | G01N 3/405 | |
| 10,982,973 B2 * | 4/2021 | Gouko | G01K 17/20 | |
| 10,996,122 B2 * | 5/2021 | Fritsch | G01L 1/122 | |
| 11,041,574 B2 * | 6/2021 | Seo | G01L 5/0038 | |
| 11,156,511 B2 * | 10/2021 | Wade | G01L 1/18 | |
| 11,331,871 B2 * | 5/2022 | Kohno | B30B 15/0094 | |
| 11,380,647 B2 * | 7/2022 | Schivalocchi | H01L 24/75 | |
| 11,590,722 B2 * | 2/2023 | Kohno | G01L 5/0076 | |
| 2004/0011119 A1 * | 1/2004 | Jardret | G01N 3/46 | 702/42 |
| 2005/0081598 A1 * | 4/2005 | Tongiani | G01G 23/01 | 73/1.08 |
| 2006/0288882 A1 * | 12/2006 | Moriya | G01L 1/2268 | 100/43 |
| 2009/0241690 A1 * | 10/2009 | Hayakawa | G01L 1/20 | 73/862.046 |
| 2012/0085154 A1 * | 4/2012 | Takemura | G06F 9/451 | 73/81 |
| 2016/0377518 A1 * | 12/2016 | Puchnin | G01B 7/003 | 73/12.09 |
| 2018/0164171 A1 * | 6/2018 | Hwang | G01L 5/0076 | |
| 2018/0290414 A1 * | 10/2018 | Kurokawa | B30B 15/28 | |
| 2019/0145878 A1 * | 5/2019 | Coudert | G01N 3/46 | 73/81 |
| 2019/0316999 A1 * | 10/2019 | Good | G01N 3/42 | |
| 2021/0170708 A1 * | 6/2021 | Schivalocchi | B22F 3/03 | |
| 2022/0001637 A1 * | 1/2022 | Schivalocchi | B30B 15/34 | |
| 2022/0170834 A1 * | 6/2022 | Kawakubo | G01N 3/42 | |
| 2022/0324190 A1 * | 10/2022 | Ishida | F16H 25/2204 | |
| 2022/0349763 A1 * | 11/2022 | Nakai | G01L 25/00 | |
| 2022/0357732 A1 * | 11/2022 | Takeda | B30B 15/28 | |
| 2022/0359459 A1 * | 11/2022 | Ding | H01L 25/50 | |

* cited by examiner

FORCE MEASUREMENT DEVICE AND METHOD FOR BONDING OR ENCAPSULATION PROCESS AND APPARATUS INCORPORATING THE DEVICE

FIELD OF THE INVENTION

The invention generally relates to the measurement of a pressing force that is being applied onto a component, such as during bonding of a component to a carrier or during encapsulation of a component, and more specifically to real-time in situ measurement of such a force.

BACKGROUND

Silver sintering has been widely used for bonding electronic components to a substrate or carrier during semiconductor assembly and packaging. It is necessary to accurately measure the sintering pressure applied to the electronic components so as to assess whether the electronic components have been successfully bonded to the substrate with the application of a correct sintering pressure, and to improve the quality of the bond formed therebetween.

There have been attempts to measure the sintering pressure exerted on electronic components which are being bonded to a substrate with load cells in a sintering apparatus. However, such load cells can only be used to measure a force exerted on the substrate, while the pressure or force applied to each die or electronic component on the substrate is not measurable. Also, as the load cells are unable to operate in high temperature environments (a sintering temperature is typically above 300° C.), cooling means are required to keep the load cells at an acceptable working temperature, while an additional heat-diffusion element is also needed to speed up the heating of a substrate support so as to effectively conduct the sintering process. As such, the sintering apparatus requires a very complex structure, which will prolong the time required for assembling and installing the sintering apparatus, and increases manufacturing costs.

In another existing approach for sintering pressure measurement as described in PCT International Publication Number 2021/075966A1 entitled "Component Processing Apparatus, such as a Pressure Sintering Apparatus or a Component Encapsulation Apparatus", a Fiber Bragg Grating (FBG) strain sensor is used to measure the force exerted on a component when the component is being bonded to a component carrier.

The FBG strain sensor is installed in a through hole formed in a stamp for applying sintering pressure onto the component. Thus, a portion of the component lying under the through hole of the stamp will not be subjected to a sintering pressure. Further, as the cable of the FBG strain sensor emerges from a top surface of the stamp, it may interfere with the application of an evenly-distributed sintering pressure onto the stamp.

Similarly, it is also important to accurately measure the pressing force that is being applied onto at least a part of a surface of an electronic component during a molding process, to avoid molding compound from covering the at least a part of the said surface of the electronic component to which the force is being applied. It would therefore be beneficial to provide a solution for accurately measuring such forces, whether during a sintering or encapsulation process, which may avoid at least some of the aforesaid shortcomings faced by conventional approaches for force measurement during sintering or encapsulating process.

SUMMARY OF THE INVENTION

It is thus an object of the invention to seek to provide an improved mechanism for sintering pressure measurement in a sintering apparatus or for the measurement of a pressing force being applied on a component in an encapsulation apparatus.

According to a first aspect of the present invention, there is provided a device for measuring a force applied to a component when the component is being bonded to a component carrier, or when the component is being encapsulated. The device includes a deformable portion configured to incorporate a sensor for detecting a degree of deformation of the deformable portion caused by application of the force in order to measure the force, and a contacting stem connected to the deformable portion, the contacting stem being positionable to contact the component or the component carrier so that the deformable portion is deformed when the force is applied to the component. In embodiments of the invention, the force may be a sintering pressure applied to the component when the component is being bonded to a component carrier or a pressing force that is applied to a component when the component is being encapsulated.

With the proposed device for force measurement, when the force is applied to a component to bond the component to the component carrier or to encapsulate the component, the deformable portion is deformed due to application of the force such that the sensor incorporated into the deformable portion can detect the degree of deformation of the deformable portion. Accordingly, the force that is applied to the component can be determined based on the detection results of the sensor. Thus, the proposed device enables component or die level force measurement in a sintering or encapsulation apparatus.

In some embodiments, the device for measuring a force may further include the sensor incorporated into the deformable portion. If the sensor is a wired one, a sensing cable may be further included in the device.

In some embodiments, the deformable portion may define a container configured for holding/mounting/housing the sensor and the sensor is attached to an internal surface of the container to detect the degree of deformation of the internal surface caused by application of the force. In one embodiment, the deformable portion includes a cut-out or trench configured for mounting the sensor.

In some embodiments, the deformable portion may further include at least one opening, each opening configured to allow a sensing cable connected to the sensor to pass through. It should be noted that the at least one opening is not necessary if the sensor is a wireless device.

In some embodiments, the device may have a T-shaped structure. Specifically, a cross-sectional width of the deformable portion along a direction substantially perpendicular to a direction of application of the force is greater than a corresponding cross-sectional width of the contacting stem to form a "T" shape. In one embodiment, the sensor and the sensing cable connected to the sensor are placed or arranged in the deformable portion along a direction parallel to this cross-sectional width of the deformable portion.

To avoid wear and tear of the device caused by application of the force and relieve stress in the device when the device is used to measure a force applied to a component, the device may further includes a narrowed connecting portion, the narrowed connecting portion being located between the deformable portion and the contacting stem, whereby the deformable portion is movable relative to the contacting stem about the connecting portion when the force is applied to the component.

To provide a device suitable for measuring a force applied to components with different shapes and/or sizes, the contacting stem may include a detachable end portion, the end portion being shaped and/or sized for contacting the component for measuring the force applied to the component. In one embodiment, the device may include a plurality of detachable end portions. Thus, when the device is used to conduct force measurement in a sintering apparatus or an encapsulation apparatus, an appropriate end portion is selected and coupled to a fixing portion of the contacting stem.

In some embodiments, the sensor includes a high temperature strain gauge which is configured to function at an operating temperature of between 150° C. and 500° C.

In some embodiments, the deformable portion may be integrally formed with a part of or the whole contacting stem. If the device further includes a narrowed connecting portion, the deformable portion may be integrally formed with both the narrowed connecting portion and at least part of the contacting stem.

In some embodiments, the deformable portion of the device may be made from a material with a Young's modulus less than that of a material from which at least a part of the contacting stem is made. In other words, the deformable portion may be made from a material more prone to deformation compared to at least part of the contacting stem, e.g. the end portion of the contacting stem. The connecting portion may be made from the same material as the deformable portion or the contacting stem.

In some embodiments of the invention, the device is disposed above the component which is to be bonded to a component carrier or to be encapsulated and used for both the application of the force and for die level force traceability. That is to say, the features of force measurement are incorporated into a stamp for applying the force to the component in the sintering or encapsulation apparatus. In these embodiments, the contacting stem of the device is positionable to contact the component when the device is in use, and the device further includes a pressing portion which is detachably mounted to the deformable portion to apply the force to the component through the deformable portion and the contacting stem.

The "detachably mounted to" in embodiments of the invention may refer to, but not limited to, "directly placed on" or "detachably secured to". For the pressing portion which is detachably mounted to the deformable portion, in one embodiment, the pressing portion may be directly placed on the deformable portion to apply the force to the component through the deformable portion and the contacting stem. In another embodiment, to prevent relative movement between the pressing portion and the deformable portion when the force is applied, the device may further include a coupling for securing the pressing portion to the deformable portion. In one example, the coupling comprises a first coupling structure on the pressing portion and a second coupling structure on the deformable portion, and the first and second coupling structures are configured to be detachably engageable with each other.

In some embodiments, the device may be disposed below the component carrier such that the force applied to the component is transferred to the device via the component carrier. In these embodiments, when the device is in use, the deformable portion and the contacting stem are located on an opposite side of the component carrier as a side where the force is applied, and the contacting stem is positioned to be in contact with the component carrier so as to receive the force via the component carrier to the contacting stem, so as to cause the deformable portion to deform.

According to a second aspect of the present invention, there is provided a sintering or encapsulation apparatus which includes a device for measuring a force applied to a component when the component is being bonded to a component carrier or when the component is being encapsulated, wherein the device includes a deformable portion configured to incorporate a sensor for detecting a degree of deformation of the deformable portion caused by application of the force in order to measure the force, and a contacting stem connected to the deformable portion, the contacting stem being positionable to contact the component or the component carrier so that the deformable portion is deformed when the force is applied to the component. The sintering or encapsulation apparatus may include one or more than one the proposed device for force measurement, each device may be configured for measuring the force applied to one or more components.

In some embodiments, when the device is in use, the contacting stem is positionable to contact the component and the device further includes a pressing portion which is detachably mounted to the deformable portion to apply the force to the component through the deformable portion and the contacting stem. In this embodiment, the functions of both the application and measurement of the force are combined in the device. In other words, the device is used as both a stamp for applying the force to the component and a device for die level or component level force measurement. To secure a position of the device relative to the component when the component is being bonded to a component carrier or being encapsulated, the deformable portion and the pressing portion may be disposed in an upper stamp holder of the apparatus and the contacting stem is disposed in a lower stamp holder of the apparatus. Further, the deformable portion disposed in the upper stamp holder may be spaced at a predetermined distance from the lower stamp holder in a direction parallel to a direction of application of the force such that the deformable portion does not contact the lower stamp holder in use so as to accurately measure the force applied to the component.

Alternatively, the device may be disposed on an opposite side of the component carrier as a side where the force is applied to measure the force applied to a component when the component is being bonded to a component carrier or when the component is being encapsulated. In these embodiments, the deformable portion and the contacting stem are located on an opposite side of the component carrier as a side where the force is applied, and the contacting stem is positioned to be in contact with the component carrier so as to receive the force via the component carrier to the contacting stem, so as to cause the deformable portion to deform. To secure a position of the device relative to the component carrier when the force is applied to the component, the apparatus may further include a device holder configured to hold at least a part of the device. The device holder may be formed in an existing supporting block of the apparatus. The device holder may have a guide/container shaped and/or sized to slidably receive the device for measuring force to secure a position of the device relative to the component carrier. For easy installation, especially when a sensing cable is connected to the sensor installed in the deformable portion of the device, the device holder may include an upper part and a lower part on which the upper part is detachably mounted. Further, to make sure the force applied to the component will not be transferred to the device holder of the apparatus, a part of the contacting stem may extend upwardly away from the device holder to avoid contact between the component carrier and the device holder so that the force applied to the component is only transferred to the corresponding device.

In some embodiments of the invention, the apparatus may comprise a sintering apparatus configured for applying the force to the component when the component is being bonded to the component carrier, or an encapsulation apparatus for encapsulating the component when a pressing force is being applied to at least partially cover a surface of the component.

According to a third aspect of the present invention, there is provided a method for measuring a force applied to a component when the component is being bonded to a component carrier by a sintering apparatus or when the component is being encapsulated by an encapsulation apparatus. The method includes the following steps: providing a device for force measurement in the sintering or encapsulation apparatus, wherein the device includes a deformable portion and a contacting stem connected to the deformable portion; positioning the contacting stem of the device into contact with the component or the component carrier and applying the force to the component; and with a sensor incorporated in the deformable portion, measuring the force applied to the component by detecting a degree of deformation of the deformable portion caused by the force.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENTS OF THE INVENTION

In general terms, the present invention proposes a mechanism for measuring a force applied to a component when the component is being bonded to a component carrier by a sintering apparatus or when the component is being encapsulated by an encapsulation apparatus. In this mechanism, a sensor, e.g., a high temperature strain gauge, is incorporated into a suitably compliant or deformable portion of a device for force measurement to detect a degree of deformation of the deformable portion caused by application of the force.

Figure 1A:
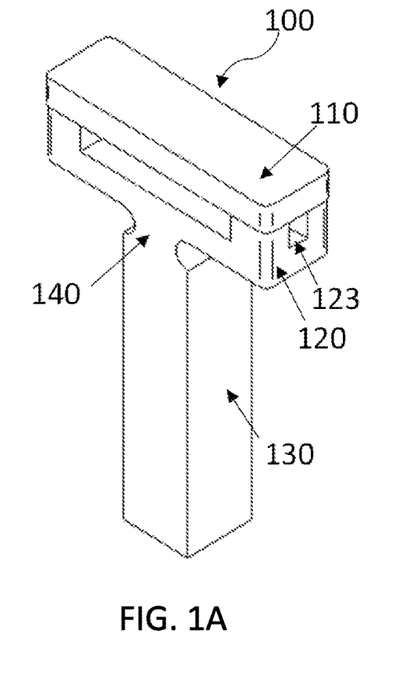
FIG. 1A and FIG. 1B respectively show a perspective view and a front view of a device for sintering pressure measurement according to a first embodiment of the invention.
Figure 1B:
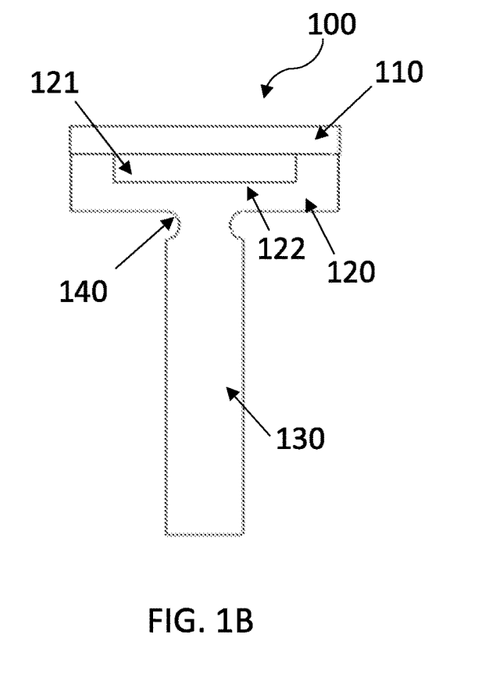
Figure 1C:
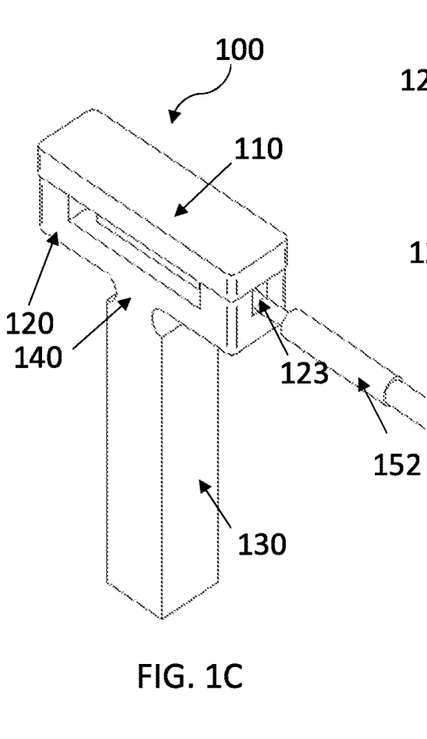
FIG. 1C and FIG. 1D respectively show a perspective view and a front view of the device for sintering pressure measurement when a sensor and a sensing cable connected to the sensor are installed therein according to the first embodiment of the invention.
Figure 1D:
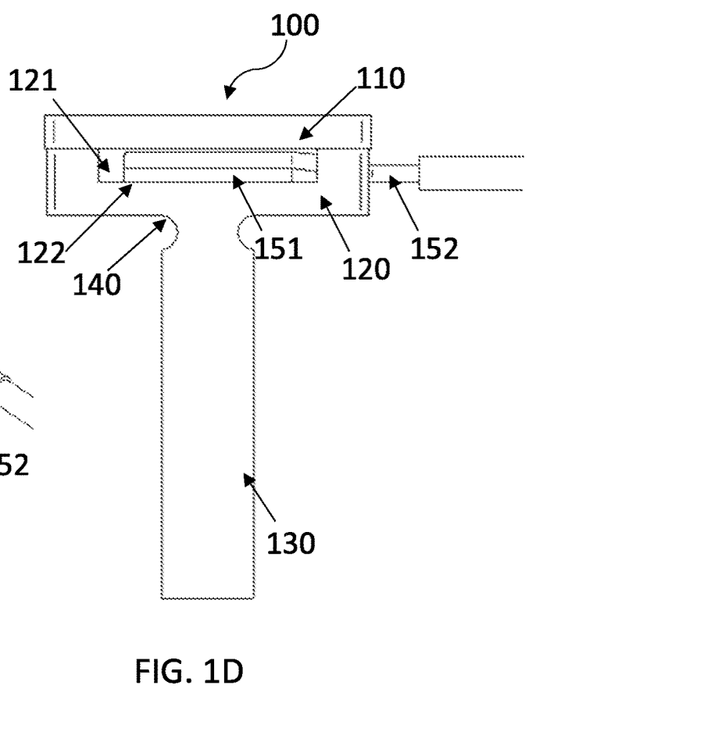

In embodiments of the present invention, when the force is applied to bond the component to the component carrier during sintering, the component which is to be bonded to the component carrier may include, but is not limited to, any one or more of the following:

a chip which is to be bonded to a substrate by sintering
a copper foil which is to be bonded to a chip by sintering
a clip which is to be bonded to a substrate by sintering
a flexible printed circuit (FPC) to be bonded to a chip or a substrate by sintering
a spacer/pillar which is to be bonded to a substrate or a chip by sintering
a terminal/lead frame/bus-bar which is to be bonded to a substrate by sintering
a substrate or metal plate which is to be bonded to a baseplate or a heat sink by sintering
a structure which is to be sintered to another sinterable structure by sintering
a molded encapsulated package which is to be bonded to a baseplate or a heat sink by sintering FIG. 1A and FIG. 1B respectively show a perspective view and a front view of a device 100 for measuring a force or sintering pressure applied to a component when the component is being bonded to a component carrier according to a first embodiment of the invention. The device 100 for measuring a sintering pressure may further include a sensor and a sensing cable connected to the sensor according to the first embodiment of the invention. FIG. 1C and FIG. 1D respectively show a perspective view and a front view of the device 100 when a sensor 151 and a sensing cable 152 connected to the sensor 151 are installed in the device 100.

Referring to FIG. 1A to FIG. 1D, the device 100 includes a pressing portion 110, a deformable portion 120, and a contacting stem 130 connected to the deformable portion 120. The pressing portion 110 is detachably mounted to the deformable portion 120. The deformable portion 120 includes or defines a cut-out or trench 121 configured for holding or mounting the sensor 151 and the sensing cable 152. Specifically, the sensor 151 is attached to an internal surface 122 of the trench 121 and the deformable portion 120 further includes at least one opening 123 configured to allow the sensing cable 152 connected to the sensor 151 to pass through. It should be noted that if a wireless sensor is used in this embodiment, the sensing cable 152 may not be required and accordingly the deformable portion 120 may not include such an opening 123. In this embodiment, the device 100 further includes a narrowed connecting portion 140 located between the deformable portion 120 and the contacting stem 130. The narrowed connecting portion 140 is a notch in the form of a circular arc.

In use, the device 100 is installed in a sintering apparatus for measuring a sintering pressure applied to a component when the component is being bonded to a component carrier by the sintering apparatus. Each sintering apparatus may include one or more devices 100 and each device 100 is used to measure the sintering pressure applied to a component which the contacting stem 130 is applying a sintering pressure to. The device 100 may further include a processor or a computing system which is configured to automatically calculate the sintering pressure applied to the component based on a strain experienced by the deformable portion 120 detected by the sensor 151 based on a known relationship between the readings of the sensor 151 and relevant sintering forces being applied. A calibration process may be conducted beforehand to determine the relationship between the strain detected in the deformable portion 120 and the sintering pressure being applied, before the device 100 is used for sintering pressure measurement.

Figure 2:
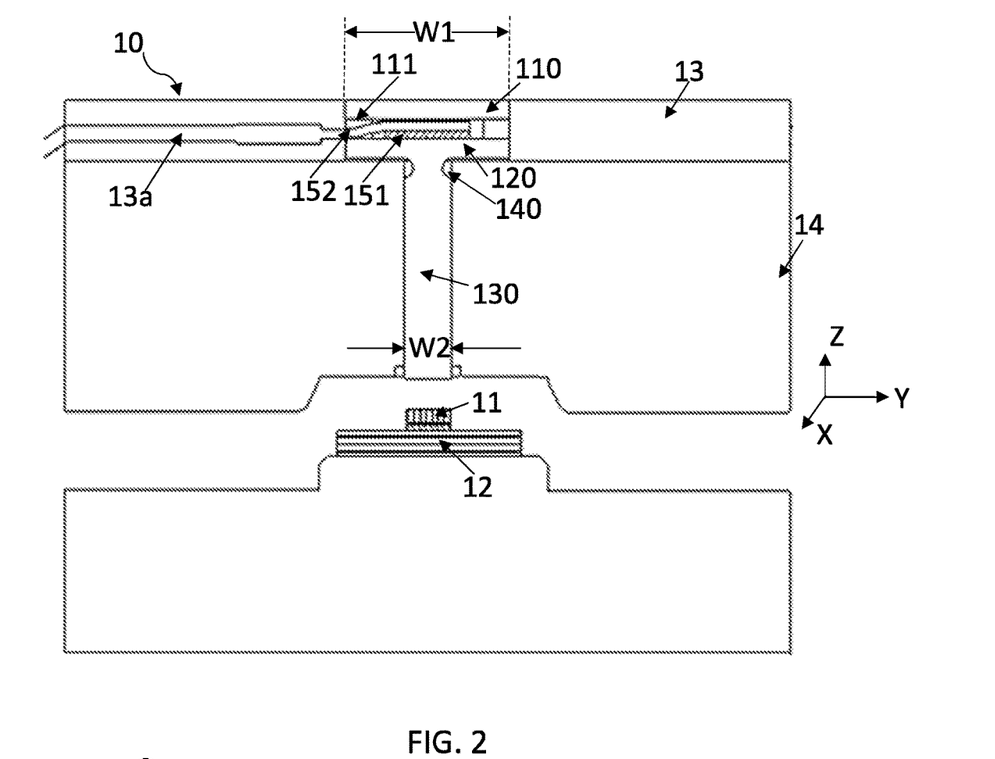
FIG. 2 is a cross-sectional view of a sintering apparatus including the device for sintering pressure measurement according to the first embodiment of the invention.

FIG. 2 is a cross-sectional view of a sintering apparatus 10 including a device 100 for sintering pressure measurement according to the first embodiment of the invention. The sintering apparatus 10 is used to bond a component 11 to a component carrier 12. As shown in FIG. 2, the sintering apparatus 10 further includes a device holder shaped and sized to hold the device 100. In this embodiment, the device holder includes an upper stamp holder 13 and a lower stamp holder 14 on which the upper stamp holder 13 is detachably mounted. The device 100 is installed in the upper stamp holder 13 and the lower stamp holder 14. Specifically, both the pressing portion 110 and the deformable portion 120 on which the pressing portion 110 is mounted are disposed in the upper stamp holder 13 and the contacting stem 130 is disposed in the lower stamp holder 14. As for the narrowed connecting portion 140, it is partially disposed in the upper stamp holder 13 and partially in the lower stamp holder 14 such that the deformable portion 120 is spaced at a predetermined distance from the lower stamp holder 14 to avoid contact between the deformable portion 120 and the lower stamp holder 14 so as to accurately measure the sintering pressure applied to the component 11. The predetermined distance of the deformable portion 120 from the lower stamp holder 14 may be determined based on the extent of deformation and mechanical properties of the deformable portion 120. In addition, for easy installation, the upper stamp holder 13 may further include a first part and a second part on which the first part is detachably mounted. The first part is shaped and sized to hold the pressing portion 110 and the second part is shaped and sized to hold the deformable portion 120 and the sensing cable 152 extending out of the deformable portion 120.

A sensor 151 and a sensing cable 152 are incorporated into the deformable portion 120 of the device 100. The upper stamp holder 13 further includes a channel 13a configured to allow the sensing cable 152 to pass through the channel 13a. In the sintering apparatus 10, the device 100 is thus used for both applying a sintering pressure applied to the component 11 and measuring the sintering pressure that is being applied.

When the component 11 is to be bonded to the component carrier 12 by the sintering apparatus 10, the device 100 is moved downwardly towards the component 11 together with the upper and lower stamp holders 13, 14 until the contacting stem 130 contacts the component 11. The pressing portion 110 then receives a sintering pressure and applies the sintering pressure received by it to the deformable portion 120 such that the sintering pressure is transferred to the component 11 through the deformable portion 120 and the contacting stem 130. When the sintering pressure is applied to the component 11, a reaction force is exerted on the contacting stem 130 by the component 11 and the deformable portion 120 starts to be deformed. The sensor 151 attached to the internal surface of the deformable portion 120 detects a degree of deformation of the deformable portion 120 caused by application of the sintering pressure to the component 11, and thereby measures the sintering pressure.

As shown in FIG. 2, the device 100 has a generally T-shaped cross section in the Y-Z plane to facilitate application of the sintering pressure and for detecting the deformation of the deformable portion 120. Specifically, a cross-sectional width W1 of the pressing portion 110 and the deformable portion 120 in the YZ plane along the Y axis is greater than a cross-sectional width W2 of the contacting stem 130 in the YZ plane along the Y axis. The sensor 151 and the sensing cable 152 are placed or arranged along the Y axis, i.e. the direction parallel to the cross-sectional width W1 of the deformable portion 120.

To ensure accurate detection of the deformation of the internal surface 122 caused by application of the sintering pressure, the deformable portion 120 in this embodiment is shaped and sized to hold the sensor 151 and the sensing cable 152 such that when the sintering pressure is applied to the component 11, the sensor 151 detects only the degree of deformation of the internal surface 122 of the deformable portion 120 caused by the sintering pressure. Thus, the height of the deformable portion 120 along the Z axis should be sufficient to avoid contact between the sensor 151 and the sensing cable 152, and a bottom surface 111 of the pressing portion 110 when the sintering pressure is applied to the component 11.

In this embodiment, the narrowed connecting portion 140 located between the deformable portion 120 and the contacting stem 130 is in the form of a notch having a circular arc. Alternatively, the narrowed connecting portion 140 may be in other forms, e.g., a notch or indention in any shape as long as the connecting portion 140 is not in contact with the lower stamp holder 14 of the sintering apparatus 10. Also, the narrowed connecting portion 140 is provided so that the deformable portion 120 is movable relative to the contacting stem 130 about the narrowed connecting portion 140, which facilitates deformation of the deformable portion 120.

In the device 100, the deformable portion 120 houses the sensor 151 and sensing cable 152. Alternatively, the deformable portion 120 may be in the form of a flat plate to which the sensor 151 is attached, while the pressing portion 110 may be in the form of a reverse U-shaped cover which is detachably mountable on the deformable portion 120. The pressing portion 110 should be shaped and sized to be detachably mountable on the deformable portion 120 and contact between the sensor 152 and the pressing portion 110 is avoided such that the sensor 152 detects the degree of deformation of the deformable portion 120 (unobstructed by the pressing portion 110 and the lower stamp holder 14) when the sintering pressure is applied by the pressing portion 110 to the component 11 via the deformable portion 120 and the contacting stem 130.

In this embodiment, the different portions of the device 100 may be made from the same material, such as the same type of stainless steel. However, to further improve the deformability of the deformable portion 120, the device 100 may be made from two different materials, e.g., the deformable portion 120 and the connecting portion 140 may be made from a material with a Young's modulus that is less than that of a material from which the contacting stem 130 is made.

In this embodiment, the deformed portion 120 may be integrally formed with the contacting stem 130 and the narrowed connecting portion 140. Alternatively, the device 100 may be formed by separate parts which are coupled to each other either with or without a coupling mechanism or structure. For example, the deformable portion 120 may be integrally formed with the connecting portion 140, but the contacting stem 140 may be a separate part which is coupled to the connecting portion 140 by a coupling mechanism or structure formed on the connecting portion 140 and the contacting stem 130 respectively.

It should be noted that in other embodiments, the device 100 may not include the narrowed connecting portion 140. In other words, the contacting stem 130 may be directly connected to the deformable portion 120.

Figure 3A:
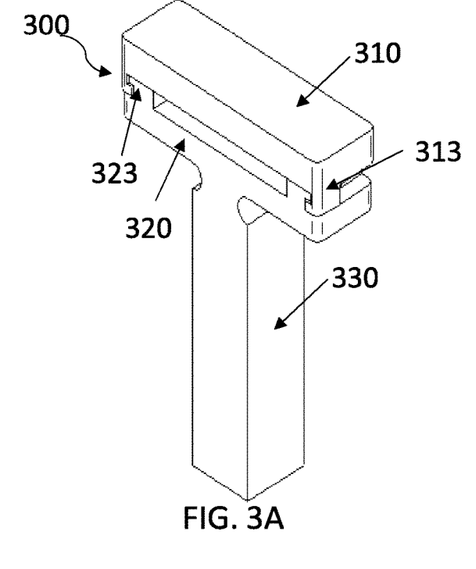
FIG. 3A to 3B respectively show a perspective view and a front view of a device for sintering pressure measurement according to a second embodiment of the invention.
Figure 3B:
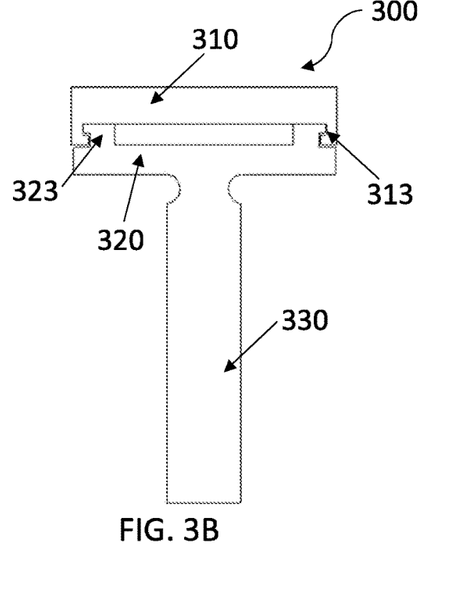

In the device 100 as shown in FIGS. 1A to 1D, the pressing portion 110 is directly mounted on the deformable portion 120 without any coupling means or coupling structures. However, in other embodiments, to further prevent relative movement between the pressing portion 110 and the deformable portion 120 when the sintering pressure is applied to the component 11, the device 100 may further include a coupling mechanism for securing the pressing portion 110 to the deformable portion 120. The coupling mechanism may include coupling structures formed on the pressing portion 110 and the deformable portion 120 respectively. FIGS. 3A to 3B respectively show a perspective view and a front view of a device 300 according to a second embodiment of the invention. Referring to FIG. 3A and FIG. 3B, as compared to the device 100, the device 300 further includes a first coupling structure 313 formed on the pressing portion 310 and a second coupling structure 323 formed on the deformable portion 320. The first coupling structure 313 and the second coupling structure 323 are configured to engage each other to secure the pressing portion 310 to the deformable portion 320, whilst the deformable portion 320 is further connected to a contacting stem 330 for contacting a component 11.

Figure 4A:
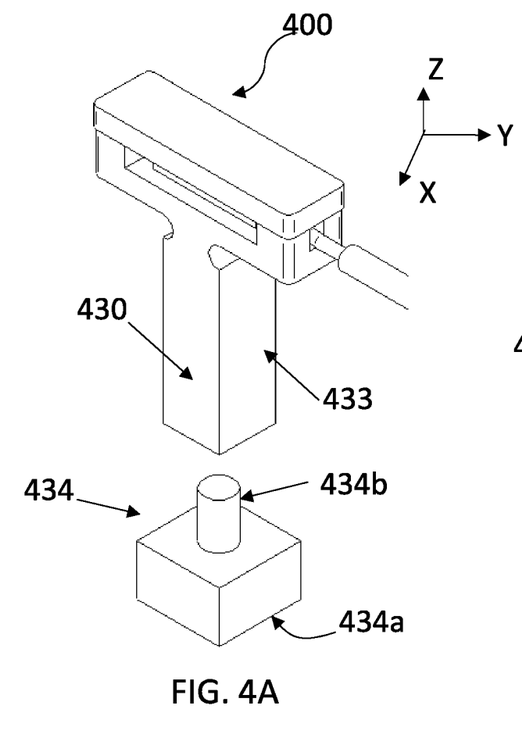
FIG. 4A shows a perspective view of a device for sintering pressure measurement when an end portion of a contacting stem is detached from a fixing portion of the contacting stem according to a third embodiment of the invention, while FIG. 4B and FIG. 4C respectively show a perspective view and a front view of the device for sintering pressure measurement when the end portion of the contacting stem is coupled to the fixing portion of the contacting stem according to the third embodiment of the invention.
Figure 4B:
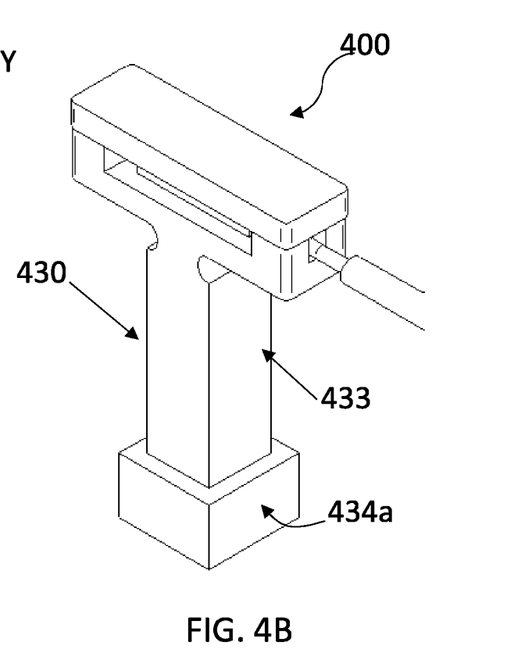
Figure 4C:
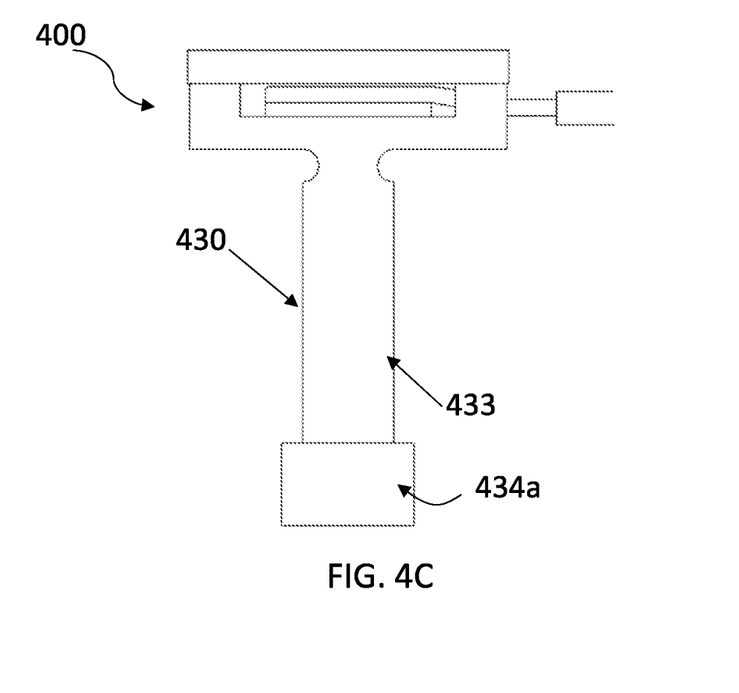

FIG. 4A to FIG. 4C show different views of a device 400 for measuring a sintering pressure according to a third embodiment of the invention. Referring to FIG. 4A to FIG. 4C, the main difference between the device 100 and the device 400 is that the contacting stem 430 includes a detachable end portion 434. FIG. 4A shows a perspective view of the device 400 when the end portion 434 is detached from the fixing portion 433 of the contacting stem 430. FIG. 4B and FIG. 4C respectively show a perspective view and a front view of the device 400 when the end portion 434 is coupled to the fixing portion 433 of the contacting stem 430. The end portion 434 includes a contacting part 434a and a mating bar 434b. The contacting part 434a has a quadrilateral cross-section in the XY plane and its cross-sectional area is greater than a cross-sectional area of the fixing portion 433 in the XY plane. The fixing portion 433 of the contacting stem 430 further includes a coupling structure, e.g., a hole, which is shaped and sized to receive the mating bar 343b so that the end portion 434 is attachable to the fixing portion 433 of the contacting stem 430. The end portion 434 in the third embodiment is provided for illustration only. In other embodiments, the end portions may have different shapes and/or sizes that are suitable for contacting different components. As such, the device 400 may be used for measuring the sintering pressure applied to different types of components with different sizes and/or shapes by simply replacing a suitable end portion without changing the entire device 400.

Figure 5:
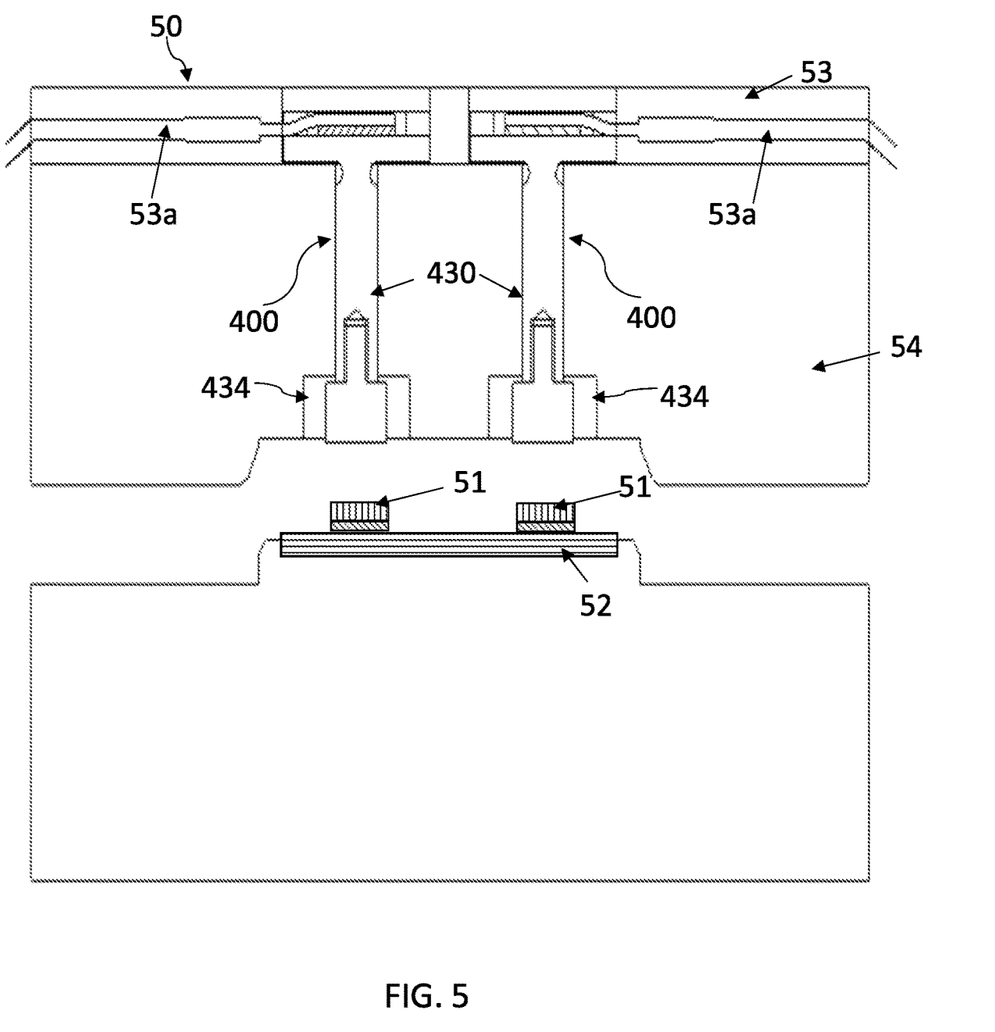
FIG. 5 is a cross-sectional view of a sintering apparatus including two devices for sintering pressure measurement according to the third embodiment of the invention.

FIG. 5 is a cross-sectional view of a sintering apparatus 50 including two devices 400 for sintering pressure measurement according to the third embodiment of the invention. Compared to the sintering apparatus 10, this sintering apparatus 50 includes two devices 400, each device 400 being configured for measuring the sintering pressure applied to a respective component 51 when each component 51 is being bonded to a common component carrier 52. As the contacting stem 430 of each device 400 has a detachable end portion 434, a lower stamp holder 54 of the sintering apparatus 50 is shaped and sized to hold the contacting stem 430 of each device 400. Specifically, the lower stamp holder 54 includes two guides configured for slidably receiving or holding the two devices 400. An upper stamp holder 53 of the sintering apparatus 50 includes two channels 53a, each being configured to allow a sensing cable 152 connected to the sensor 151 installed in the deformable portion of a corresponding device 400 to pass through the channel 53a.

In both sintering apparatuses 10, 50, the devices 100, 400 are installed above the components 11, 51 such that the devices 100, 400 are used for both applying the sintering pressure to the components 11, 51 and for measuring the sintering pressure applied onto the components 11, 51. Alternatively, in some other embodiments, a device for measuring the sintering pressure may be installed below the component carrier.

Figure 6A:
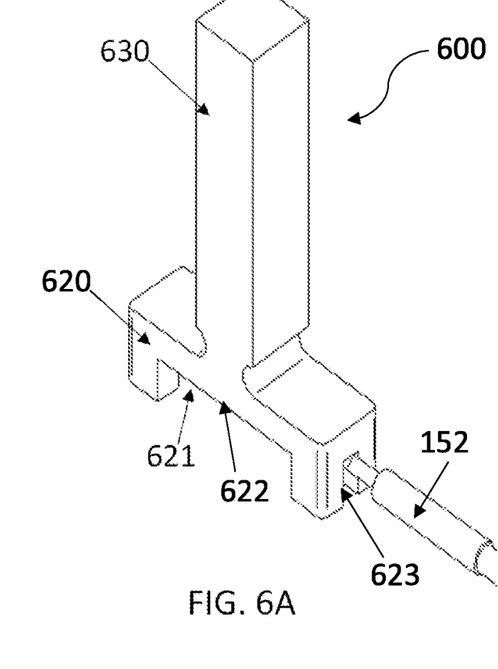
FIG. 6A to FIG. 6C respectively show a perspective view, a side view and a front view of a device for sintering pressure measurement according to a fourth embodiment of the invention.
Figure 6B:
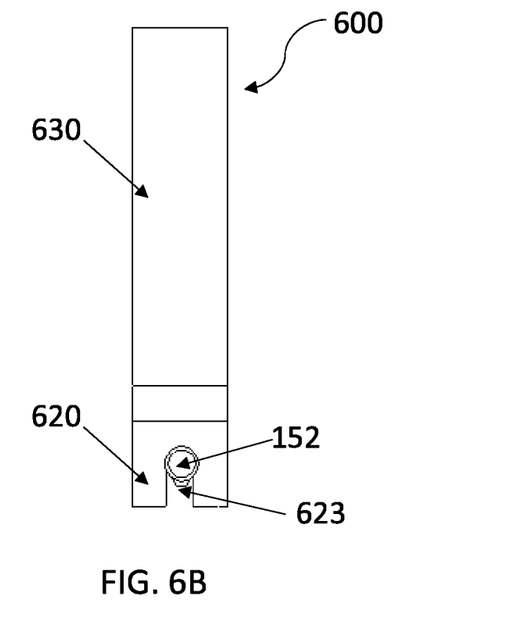
Figure 6C:
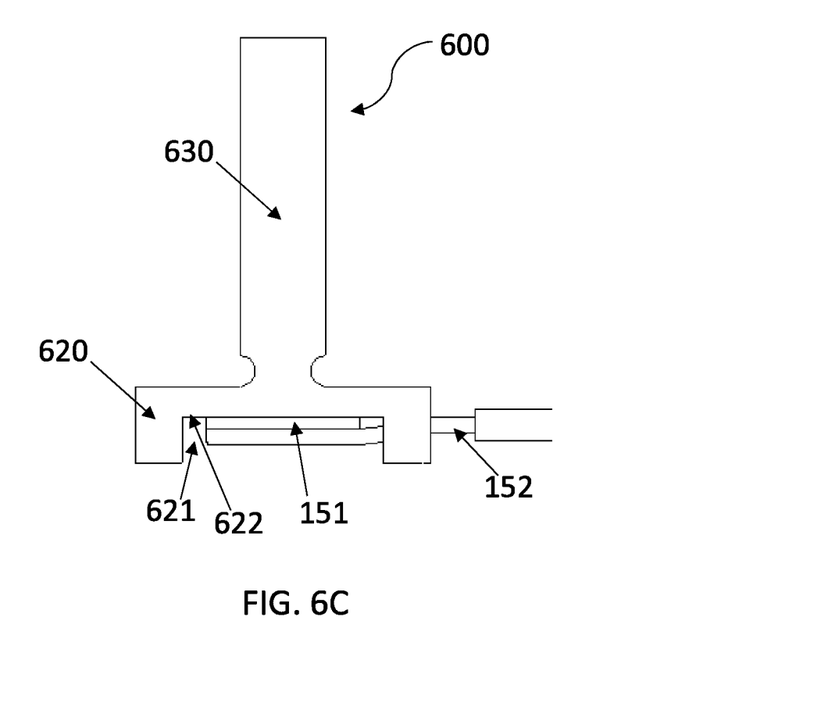

FIG. 6A to FIG. 6C respectively show a perspective view, a side view and a front view of a device 600 for sintering pressure measurement according to a fourth embodiment of the invention. Referring to FIG. 6A to FIG. 6C, the device 600 includes a deformable portion 620 and a contacting stem 630. The deformable portion 620 is configured to incorporate a sensor 151 for detecting a degree of deformation of the deformable portion 620 caused by the application of sintering pressure in order to measure the sintering pressure. The sensor 151 is attached to an internal surface 622 of a trench 621 of the deformable portion 620. A sensing cable 152 is connected to the sensor 151, which is passed through an opening 623 of the deformable portion 620. Unlike the device 100, the device 600 does not include a pressing portion 110 and when the device 600 is used to measure a sintering pressure applied to a component which is being bonded to a component carrier, the device 600 is located below the component carrier. Thus, the contacting stem 630 is positioned to be in contact with the component carrier so as to receive the sintering pressure applied to the component to cause the deformable portion 620 to deform. The contacting stem 630 has a similar structure as the contacting stem 130 in the device 100. In other embodiments, the contacting stem 630 may have a similar structure as the contacting stem 430 of the device 400, i.e., the contacting stem 630 may include a detachable end portion which is shaped and sized to contact the component which is to be bonded to a component carrier.

Figure 7:
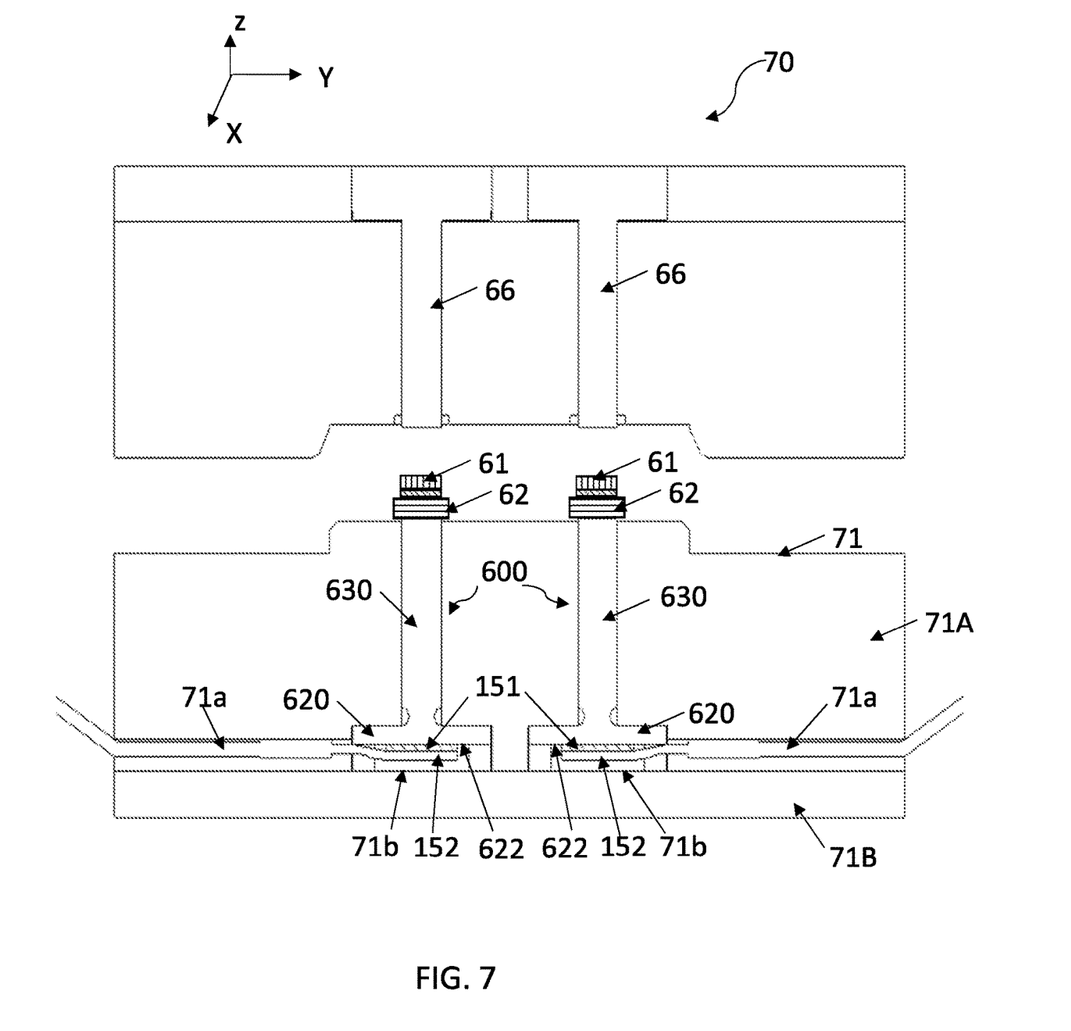
FIG. 7 is a cross-sectional view of a sintering apparatus including two devices for sintering pressure measurement according to the fourth embodiment of the invention.

FIG. 7 is a cross-sectional view of a sintering apparatus 70 including two devices 600 for sintering pressure measurement according to the fourth embodiment of the invention. In each device 600, a sensor 151 and a sensing cable 152 connected to the sensor 151 are installed. Referring to FIG. 7, the sintering apparatus 70 includes two devices 600, each device 600 being configured for measuring the sintering pressure applied to a respective component 61 when the component 61 is being bonded to a separate component carrier 62. Unlike the sintering apparatuses 10, 50 previously described, each device 600 is disposed below a respective component carrier 62. The sintering apparatus 70 further includes a device holder 71 configured for holding at least a part of each device 600 for securing a position of each device 600 relative to a respective component carrier 62. The device holder 71 may be defined/formed in an existing supporting block of the sintering apparatus 70. As shown in FIG. 7, the device holder 71 includes two reverse T-shaped guides or containers, and each guide is shaped and sized to slidably receive a respective device 600 to secure a position of the device 600 relative to a respective component carrier 62. The device holder 71 further includes a channel 71a configured to allow a sensing cable 152 connected to a sensor 151 which is installed in each device 600 to pass through the channel 71a. For easy installation, the device holder 71 may include an upper part 71A and a lower part 71B on which the upper part 71A is detachably mounted.

When the sintering pressure is applied to the component 61 by a stamp 66 to bond the component 61 to the component carrier 62, the sintering pressure applied to the component 61 is transferred to the device 600 which is located below the component carrier 62 and in contact with a bottom surface of the component carrier 62. The contacting stem 630 of the device 600 receives the force transferred through the component carrier 62, and the deformable portion 620 is deformed by the force received by the contacting stem 630. The sensor 151 attached to the internal surface 622 of the deformable portion 620 detects the degree of deformation of the internal surface 622 in order to measure the sintering pressure applied to the component 61.

As shown in FIG. 7, a part of the contacting stem 630 extends upwardly away from the device holder 71 to avoid contact between the component carrier 62 and the device holder 71 so that the sintering pressure applied to the component 61 is only transferred to the corresponding device 600.

To ensure accurate detection of the deformation of the internal surface 622 caused by application of the sintering pressure, in this embodiment, the deformable portion 620 is shaped and sized to hold the sensor 151 as well as the sensing cable 152 such that when the sintering pressure is applied to the component 61, the sensor 151 only detects the degree of deformation of the internal surface 622 of the deformable portion 620. For example, the height of the deformable portion 620 along the Z axis should be sufficient to avoid contact between the sensor 151 and a lower surface 71b of the device holder 71 and the contact between the sensing cable 152 and the lower surface 71b when the sintering pressure is applied to the component 61.

Figure 8A:
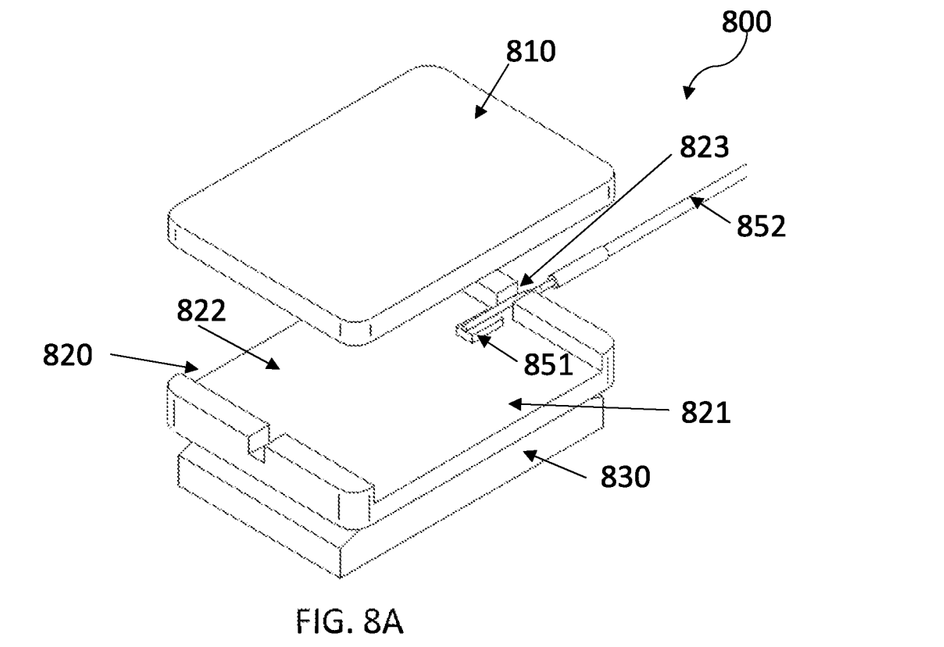
FIG. 8A and FIG. 8B respectively show a perspective view and a front view of a device for force measurement during encapsulation according to a fifth embodiment of the invention.
Figure 8B:
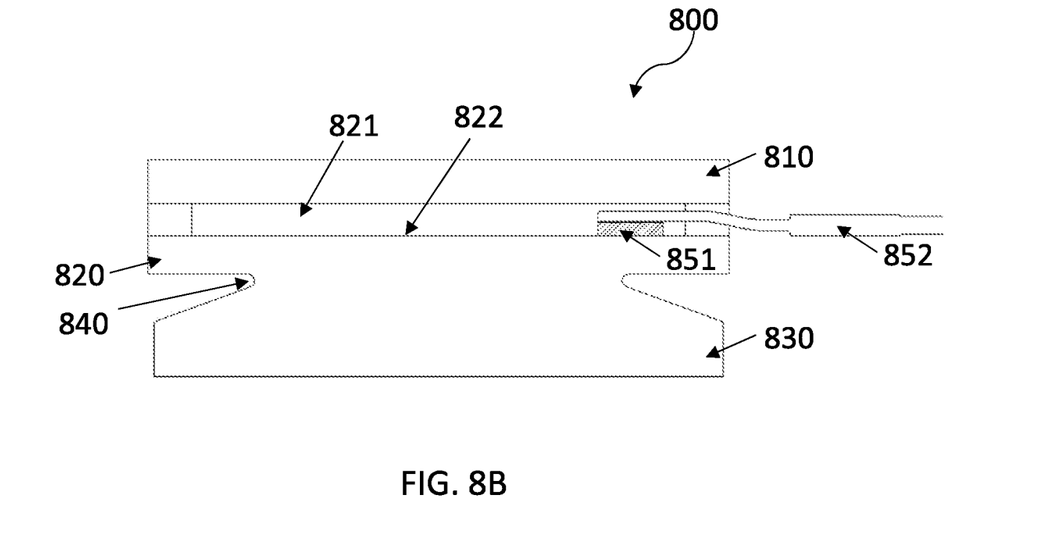

FIG. 8A and FIG. 8B respectively show a perspective view and a front view of a device 800 for force measurement according to a fifth embodiment of the invention. Referring to FIGS. 8A and 8B, the device 800 includes a pressing portion 810, a deformable portion 820 and a contacting stem 830 connected to the deformable portion 820. The pressing portion 810 is detachably mounted to the deformable portion 820 so as to apply a pressing force to the component to be encapsulated through the deformable portion 820 and the contacting portion 830. The deformable portion 820 defines a cut-out, trench or space 821 configured for holding or mounting the sensor 851 and the sensing cable 852 for measuring the pressing force applied during encapsulation. As shown in FIG. 8A, the sensor 851 is attached to an internal surface 822 of the deformable portion 820, and the deformable portion 820 further includes at least one opening 823 configured to allow the sensing cable 852 connected to the sensor 851 to pass through. In this embodiment, the device 800 further includes a narrowed connecting portion 840 located between the deformable portion 820 and the contacting stem 830.

In use, the device 800 is installed in an encapsulation apparatus for measuring a force applied to a component when the component is being encapsulated by the encapsulation apparatus. Each encapsulation apparatus may include one or more devices 800 and each device 800 may be used to measure the force applied to one or more components.

Figure 8C:
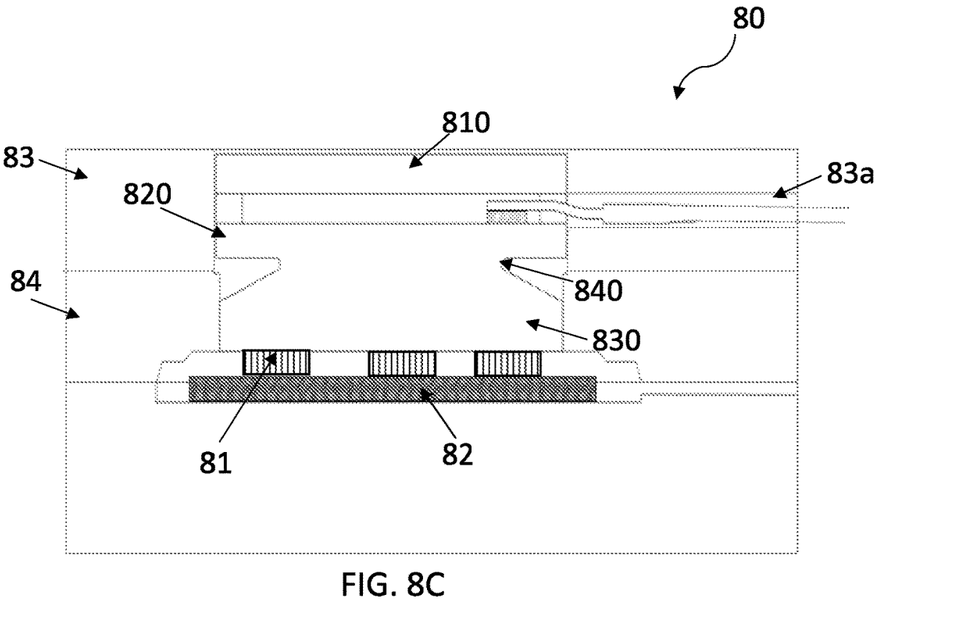
FIG. 8C is a cross-sectional view of an encapsulation apparatus including a device for force measurement according to the fifth embodiment of the invention.

FIG. 8C is a cross-sectional view of an encapsulation apparatus 80 including a device 800 for force measurement according to the fifth embodiment of the invention. The encapsulation apparatus 80 is used to encapsulate components 81 which have been bonded to a component carrier 82, e.g., a substrate. As shown in FIG. 8C, the encapsulation apparatus 80 further includes a device holder shaped and sized to hold the device 800. In this embodiment, the device holder includes an upper stamp holder 83 and a lower stamp holder 84 on which the upper stamp holder 83 is detachably mounted. The device 800 is installed in the upper and lower stamp holders 83, 84. Specifically, both the pressing portion 810 and the deformable portion 820 on which the pressing portion 810 is mounted are disposed in the upper stamp holder 83 and the contacting stem 830 is disposed in the lower stamp holder 84. As for the narrowed connecting portion 840, it is partially disposed in the upper stamp holder 83 and partially in the lower stamp holder 84 such that the deformable portion 820 is spaced at a predetermined distance from the lower stamp holder 84 to avoid contact between the deformable portion 820 and the lower stamp holder 84 so as to accurately measure the force being applied to the components 81. The upper stamp holder 83 further includes a channel 83a configured to allow the sensing cable 852 to pass through the channel 83a. In addition, for easy installation, the upper stamp holder 83 may further include a first part and a second part on which the first part is detachably mounted. The first part is shaped and sized to hold the pressing portion 810 and the second part is shaped and sized to hold the deformable portion 820 and the sensing cable 852 extending out of the deformable portion 820.

When the components 81 are being encapsulated by the encapsulation apparatus 80, a force is applied to the pressing portion 810 of the device 800 and transferred to the components 81 via the deformable portion 820 and the contacting stem 830 of the device 800. This is to prevent molding compound from covering a top surface of each of the components 81. When the force is applied to the components 81 during encapsulation of the components 81, a reaction force is exerted on the contacting stem 830 by the components 81 and the deformable portion 820 of the device 800 starts to be deformed. The sensor 851 attached to the internal surface of the deformable portion 820 detects a degree of deformation of the deformable portion 820 caused by application of the pressing force, and thereby measures the said pressing force.

In the fifth embodiment, the device 800 is used to measure the pressing force applied to one or more components. However, in other embodiments, the device 800 may be used to measure the pressing force applied to a single component, e.g., a die, which has been bonded to a component carrier, e.g., a substrate. Further, in other embodiments of the invention, an encapsulation apparatus may include more than one device for force measurement, e.g., the device 800, and each device may be used to measure the pressing force applied to one or more components.

In addition, similar to the sintering apparatus as shown in FIG. 7, at least one device for force measurement may also be located on an opposite side of the component carrier as a side where the pressing force is applied to measure the pressing force, and the contacting stem is positioned to be in contact with the component carrier so as to receive the pressing force applied via the component carrier to the contacting stem, so as to cause the deformable portion to deform.

The sintering apparatus 10, 50, 70 or encapsulation apparatus 80 disclosed in embodiments of the invention may further include a human machine interface (HMI) in operative communication with the sensor 151/851 for receiving and displaying a result of measurement from the sensor 151/851, a database or memory for receiving and storing the result of measurement from the sensor 151/851, a manufacturing execution system (MES) in operative communication with the sensor 151/851 for conducting force traceability based on the result of measurement from the sensor 151/851, and/or an adaptive system configured and operative to determine compensation factors for the sintering or encapsulation apparatus to conduct subsequent sintering process or encapsulating process for improving the processes based on the result of measurement from the sensor 151/851. The force traceability may be a component or die-level force traceability.

Figure 9:
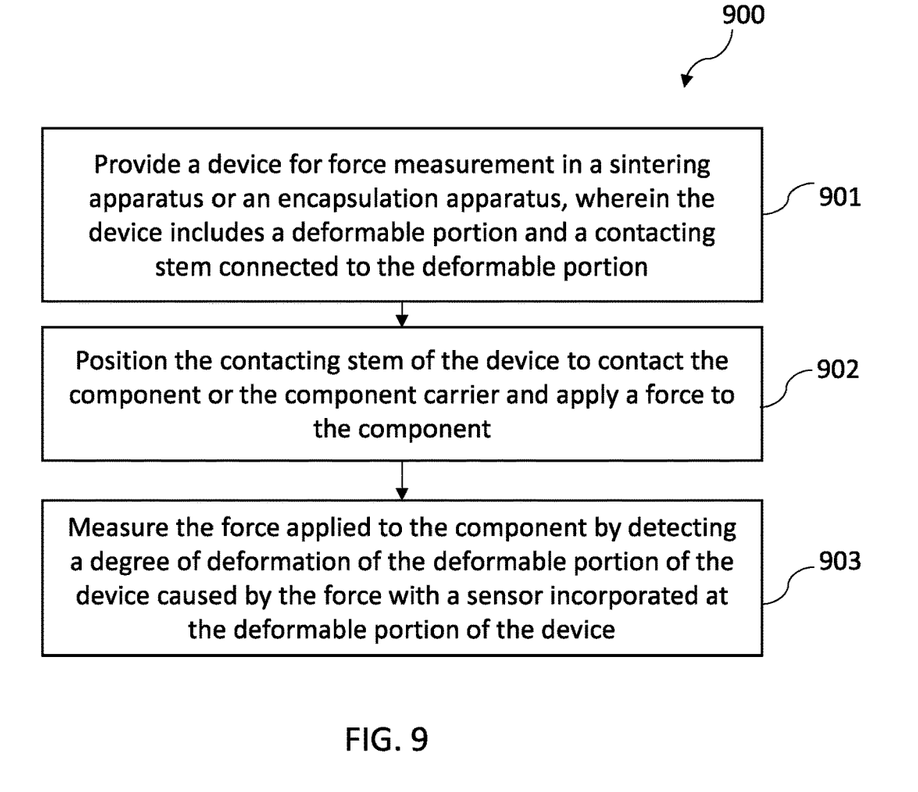
FIG. 9 is a flow chart illustrating a method for force measurement that is applicable to various embodiments of the invention described herein.

FIG. 9 is a flow chart illustrating a method 900 for force measurement that is applicable to various embodiments of the invention described herein.

At Step 901, a device for force measurement is provided in a sintering apparatus or an encapsulation apparatus, wherein the device includes a deformable portion and a contacting stem connected to the deformable portion.

The step of providing the device in the sintering or encapsulation apparatus may include a step of installing a sensor in the device. Specifically, the sensor is attached to an internal surface of the deformable portion. If the sensor is not a wireless one, the step of providing the device may further include a step of connecting the sensing cable to the sensor. Furthermore, the sensing cable is passed through an opening of the deformable portion of the device.

When the device 100, 300, 400 or 800 is installed in the sintering apparatus or the encapsulation apparatus, the device is disposed in an upper stamp holder and a lower stamp holder of the sintering apparatus or the encapsulation apparatus so that the contacting stem of the device is positioned to contact the component when the component is being bonded to the component carrier by the sintering apparatus or when the component is being encapsulated by the encapsulation apparatus. When the device 600 is installed in the sintering apparatus, the device is disposed in a device holder of the sintering apparatus below the component carrier to secure a position of the device relative to the component carrier.

At Step 902, the contacting stem of the device is positioned to contact the component or the component carrier and a force is applied to the component.

When the device 100, 300 or 400 is installed in the sintering apparatus, this step includes: the device is moved downwardly towards the component such that the contacting stem of the device contacts the component and a sintering pressure is applied via a pressing portion of the device to the component through the deformable portion and the contacting stem of the device.

When the device 600 is installed in the sintering apparatus, the contacting stem of the device is positioned to contact the component carrier, and a stamp in the sintering apparatus is operated to apply a sintering pressure to the component.

When the device 800 is installed in the encapsulation apparatus, the contacting stem of the device is positioned in contact with the component to be encapsulated and a pressing force is applied via a pressing portion of the device to the component through the deformable portion and the contacting stem of the device.

At Step 903, the force applied to the component is measured by detecting a degree of deformation of the deformable portion of the device caused by the force being applied to the component with a sensor incorporated at the deformable portion.

The force applied to the component may be determined based on a strain measured by the sensor. In this embodiment, the device for force measurement may further include a processor or a computing system which is configured to automatically calculate the force applied to the component based on the reading of the sensor and a predetermined variation between an amount of strain detected by the sensor and the force applied to the component. This predetermined variation may be determined by a calibration process conducted before the device is used to measure the force.

As will be appreciated from the above description, various devices for die-level or component-level force measurement in a sintering apparatus or an encapsulation apparatus are provided in the described embodiments of the invention. In the proposed devices, a sensor such as a high temperature strain gauge, is incorporated into a deformable portion of the device to detect a degree of deformation of the deformable portion caused by application of a sintering pressure or a pressing force to a component, e.g. a die. When a plurality of the devices proposed in embodiments of the invention are installed in a sintering apparatus for bonding a plurality of components onto one or more component carriers, the sintering pressure applied to each component can be accurately measured by a respective device. Thus, the devices and sintering apparatuses proposed in embodiments of the invention enable die-level or component-level sintering force traceability. Similarly, the devices and encapsulation apparatus according to embodiments of the invention will enable die-level or component-level force traceability. Further, as the sensor is held in a space defined by the deformable portion and is only in contact with an internal surface of the deformable portion, the introduction of the sensor into the device for force measurement would not affect the application of force onto the component. If a polyimide film is present in the sintering apparatus, the function of the polyimide film which is used for evenly distributing the sintering pressure onto the stamp of the sintering apparatus is also not affect. Hence, the proposed devices for sintering pressure measurement may have simple and compact structures which enable easy installation of the devices in a sintering apparatus. In addition, as compared to a conventional sintering apparatus, since a high temperature strain gauge is incorporated into the device for force measurement, neither a cooling system for providing a suitable operational environment for the sensor, nor an additional heat-diffusion element for speeding up the heating of a substrate support is required in the sintering apparatus.

Although the present invention has been described in considerable detail with reference to certain embodiments, other embodiments are possible. Therefore, the spirit and scope of the appended claims should not be limited to the description of the embodiments contained herein.

The invention claimed is:

1. A device for measuring a force applied to a component when the component is being bonded to a component carrier, or when the component is being encapsulated, the device comprising:
   a deformable portion configured to form a container having an internal surface to which a sensor is attached for detecting a degree of deformation of the internal surface caused by application of the force to the component in order to measure the force, and
   a contacting stem connected to the deformable portion for transferring the force to the component or receiving the force from the component carrier, the contacting stem being positioned to contact the component or the component carrier in use so that the deformable portion is deformed when the force is applied to the component,
   wherein the internal surface is opposite to a surface of the deformable portion to which the contacting stem is connected.

2. The device according to claim 1, wherein the container formed by the deformable portion includes a trench or cut-out defined by the deformable portion, wherein the sensor is attached to an internal surface of the trench to detect the degree of deformation of the internal surface caused by application of the force.

3. The device according to claim 1, wherein the deformable portion further comprises an opening configured to allow a sensing cable connected to the sensor to pass through.

4. The device according to claim 1, wherein a cross-sectional width of the deformable portion along a direction substantially perpendicular to a direction of application of the force is greater than a corresponding cross-sectional width of the contacting stem to form a "T" shape.

5. The device according to claim 1, further comprising a narrowed connecting portion located between the deformable portion and the contacting stem, the narrowed connecting portion being narrower than both the deformable portion and the contacting stem, whereby the deformable portion is movable relative to the contacting stem about the connecting portion when the force is applied to the component.

6. The device according to claim 1, wherein the contacting stem comprises a detachable end portion, the end portion being shaped and/or sized for contacting the component for measuring the force applied to the component.

7. The device according to claim 1, wherein the sensor comprises a high temperature strain gauge which is configured to function at a process temperature of between 150° C. and 500° C.

8. The device according to claim 1, wherein the deformable portion is integrally formed with at least a part of the connecting stem.

9. The device according to claim 1, wherein the deformable portion is made from a material with a Young's modulus less than that of a material from which at least a part of the contacting stem is made.

10. The device according to claim 1, wherein the contacting stem is positionable to contact the component when the device is in use, and the device further comprises a pressing portion which is detachably mountable to the deformable portion to apply the force to the component through the deformable portion and the contacting stem.

11. The device according to claim 10, further comprising a coupling for securing the pressing portion to the deformable portion to prevent relative movement therebetween.

12. The device according to claim 11, wherein the coupling comprises a first coupling structure on the pressing portion and a second coupling structure on the deformable portion, and the first and second coupling structures are configured to be detachably engageable with each other.

13. The device according to claim 1, wherein in use, the deformable portion and the contacting stem are located on an opposite side of the component carrier as a side where the force is applied, and the contacting stem is positioned to be in contact with the component carrier so as to receive the force applied via the component carrier to the contacting stem, so as to cause the deformable portion to deform.

14. A sintering or encapsulation apparatus comprising:
   a device for measuring a force applied to a component when the component is being bonded to a component carrier by the apparatus, or when the component is being encapsulated by the apparatus, wherein the device comprises:
   a deformable portion configured to form a container having an internal surface to which a sensor is attached for detecting a degree of deformation of the internal surface caused by application of the force to the component in order to measure the force, and
   a contacting stem connected to the deformable portion for transferring the force to the component or receiving the force from the component carrier, the contacting stem being positioned to contact the component or the component carrier in use so that the deformable portion is deformed when the force is applied to the component,
   wherein the internal surface is opposite to a surface of the deformable portion to which the contacting stem is connected.

15. The apparatus according to claim 14, wherein the contacting stem is positionable to contact the component and the device further comprises a pressing portion which is detachably mounted to the deformable portion to apply the force to the component through the deformable portion and the contacting stem, and wherein the deformable portion and the pressing portion are disposed in an upper stamp holder of the apparatus and the contacting stem is disposed in a lower stamp holder of the apparatus, and wherein the upper stamp holder is detachably mounted on the lower stamp holder.

16. The apparatus according to claim 15, wherein the deformable portion disposed in the upper stamp holder is spaced at a predetermined distance from the lower stamp holder in a direction parallel to a direction of application of the force such that the deformable portion does not contact the lower stamp holder in use.

17. The apparatus according to claim 14, wherein the deformable portion and the contacting stem are located on an opposite side of the component carrier as a side where the force is applied, and the contacting stem is positioned to be in contact with the component carrier so as to receive the force applied via the component carrier to the contacting stem, so as to cause the deformable portion to deform.

18. The apparatus according to claim 17, further comprising a device holder having a guide shaped and/or sized to slidably receive the device to secure a position of the device relative to the component carrier.

19. The apparatus according to claim 14, further comprising a human machine interface (HMI) in operative communication with the sensor for receiving and displaying a result of force measurement from the sensor, a database for receiving and storing the result of force measurement from the sensor, a manufacturing execution system (MES) in operative communication with the sensor for conducting force traceability based on the result of force measurement from the sensor, and/or an adaptive system configured and operative to determine compensation factors for the apparatus to conduct subsequent sintering or encapsulating process based on the result of force measurement from the sensor.

20. A method for measuring a force applied to a component when the component is being bonded to a component carrier by a sintering apparatus, or when the component is being encapsulated by an encapsulation apparatus, the method comprising:

provi​ding a device for force measurement in the sintering or encapsulation apparatus, wherein the device comprises a deformable portion forming a container having an internal surface to which a sensor is attached and a contacting stem connected to the deformable portion for transferring the force to the component or receiving the force from the component carrier, wherein the internal surface is opposite to a surface of the deformable portion to which the contacting stem is connected, positioning the contacting stem of the device into contact with the component or the component carrier and applying the force to the component, and with the sensor attached to the internal surface of the container formed by the deformable portion, measuring the force applied to the component by detecting a degree of deformation of the internal surface caused by the force.

* * * * *